United States Patent
Yamaguchi et al.

(10) Patent No.: US 11,381,218 B2
(45) Date of Patent: Jul. 5, 2022

(54) HIGH-FREQUENCY MODULE

(71) Applicant: Murata Manufacturing Co., Ltd., Kyoto (JP)

(72) Inventors: Yukiya Yamaguchi, Kyoto (JP); Shun Harada, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 153 days.

(21) Appl. No.: 17/012,825

(22) Filed: Sep. 4, 2020

(65) Prior Publication Data

US 2020/0403596 A1 Dec. 24, 2020

Related U.S. Application Data

(63) Continuation of application No. PCT/JP2019/012316, filed on Mar. 25, 2019.

(30) Foreign Application Priority Data

Mar. 29, 2018 (JP) .............................. JP2018-064041

(51) Int. Cl.
*H03H 7/46* (2006.01)
*H03H 9/46* (2006.01)

(52) U.S. Cl.
CPC ............... *H03H 7/46* (2013.01); *H03H 9/46* (2013.01)

(58) Field of Classification Search
CPC .. H03H 9/46; H03H 9/54; H03H 9/64; H03H 7/46
See application file for complete search history.

(56) References Cited

U.S. PATENT DOCUMENTS 6,111,479 A * 8/2000 Myohga ............... H05K 1/0233
361/780
6,303,998 B1 10/2001 Murayama
(Continued)

FOREIGN PATENT DOCUMENTS

JP 2012044290 A 3/2012
JP 2014212356 A 11/2014
(Continued)

OTHER PUBLICATIONS

Office Action for Korean Application No. 10-2020-7022101 dated Jan. 21, 2022.
(Continued)

*Primary Examiner* — Dean O Takaoka
*Assistant Examiner* — Alan Wong
(74) *Attorney, Agent, or Firm* — Pearne & Gordon LLP

(57) ABSTRACT

A high-frequency module includes a high-frequency switch, filters (21 to 23), (31 to 33), and connection circuits (41 to 46). The high-frequency switch has filter-side terminals (Ps1 to Ps 6). The filters (21, 22, 23) each include a plurality of filters having characteristics different from each other. The filters (31, 32, 33) each include one type of filter. The connection circuits (41, 42, 43) connect the terminals (Ps1, Ps2, Ps3) of the high-frequency switch to the common terminals (Pc21, Pc22, Pc23) of the filters (21, 22, 23), respectively. The connection circuits (44, 45, 46) connect the terminals (Ps4, Ps5, Ps6) of the high-frequency switch to the filters (31, 32, 33), respectively. The connection circuits (41, 42, 43) are shorter than the connection circuits (44, 45, 46).

20 Claims, 10 Drawing Sheets

(56) References Cited

U.S. PATENT DOCUMENTS

| | | | |
|---|---|---|---|
| 7,777,592 B2* | 8/2010 | Nishigaki | H03H 9/0571 |
| | | | 333/133 |
| 9,240,811 B2* | 1/2016 | Norholm | H04B 1/56 |
| 10,153,797 B2* | 12/2018 | Aramata | H04L 5/14 |
| 10,454,450 B2* | 10/2019 | Uejima | H04B 1/40 |
| 10,715,097 B2* | 7/2020 | Harada | H03H 9/0566 |
| 10,868,518 B2* | 12/2020 | Kawasaki | H03H 9/70 |
| 10,879,942 B2* | 12/2020 | Takenaka | H04B 1/0057 |
| 10,924,070 B2* | 2/2021 | Kita | H03F 3/195 |
| 2012/0208591 A1 | 8/2012 | Uejima | |
| 2013/0176915 A1 | 7/2013 | Uejima | |
| 2013/0272176 A1 | 10/2013 | Uejima | |
| 2017/0194993 A1 | 7/2017 | Watanabe | |

FOREIGN PATENT DOCUMENTS

| | | | |
|---|---|---|---|
| JP | 2014239379 A | 12/2014 | |
| JP | 2017098630 A | 6/2017 | |
| KR | 2007-0110957 A | 11/2007 | |
| WO | 9934436 A1 | 7/1999 | |
| WO | 2012043429 A | 4/2012 | |
| WO | 2012093539 A1 | 7/2012 | |

OTHER PUBLICATIONS

International Search Report issued in Application No. PCT/JP2019/012316, dated Jun. 18, 2019.
Written Opinion issued in Application No. PCT/JP2019/012316, dated Jun. 18, 2019.

* cited by examiner

HIGH-FREQUENCY MODULE

This is a continuation of International Application No. PCT/JP2019/012316 filed on Mar. 25, 2019 which claims priority from Japanese Patent Application No. 2018-064041 filed on Mar. 29, 2018. The contents of these applications are incorporated herein by reference in their entireties.

BACKGROUND OF THE DISCLOSURE

1. Field of the Disclosure

The present disclosure relates to a high-frequency module for communicating high-frequency signals in a plurality of communication bands.

2. Description of the Related Art

In recent years, a communication terminal such as a mobile communication device needs to be reduced in size, and to support a plurality of communication bands as a single communication terminal.

To achieve this, for example, a module for high-frequency signal described in Japanese Unexamined Patent Application Publication No. 2014-239379 includes a switch element, and a plurality of filters.

The switch element includes an antenna-side connection terminal connected to an antenna, and a plurality of filter-side connection terminals connected to the filters. The switch element selectively connects one of the plurality of filter-side connection terminals to the antenna-side connection terminal.

The plurality of filters includes a duplexer in which two filters having characteristics different from each other are combined, and a single filter. The duplexer and the single filter are connected to the respective filter-side connection terminals different from each other in the switch element.

However, in the configuration of the above-described module, there is a portion where insertion loss increases depending on a wiring pattern connecting each of the duplexer and the single filter and the switch element. Accordingly, in the above-described module, transmission characteristics may deteriorate.

BRIEF SUMMARY OF THE DISCLOSURE

Thus, an object of the present disclosure is to provide a high-frequency module that, while including a multiplexer having a duplexer and a single filter, has excellent transmission characteristics.

The high-frequency module according to preferred embodiments of the present disclosure includes a switch, a multiplexer, and a single filter. The switch has a common terminal, and a first selection terminal and a second selection terminal one of which is selectively connected to the common terminal. The multiplexer is connected to the first selection terminal. The single filter is connected to the second selection terminal. An electrical distance of a transmission path connecting the first selection terminal and the multiplexer is shorter than an electrical distance of a transmission path connecting the second selection terminal and the single filter.

In this configuration, an electrical distance of a transmission path between the multiplexer and the switch (simply referred to as the distance of the transmission path), in which insertion loss is likely to be large, is shorter than an electrical distance of a transmission path between the single filter and the switch (simply referred to as the distance of the transmission path). This reduces the insertion loss for a high-frequency signal in a communication band that is transmitted through a side of the multiplexer. On the other hand, since the insertion loss of the single filter itself is originally small for a high-frequency signal in a communication band that is transmitted through a side of the single filter, influence on transmission loss of the high-frequency module is small, even when a transmission path on a side of the single-filter is made longer than a transmission path on a side of the multiplexer. Thus, transmission characteristics of the high-frequency module are improved.

The high-frequency module according to preferred embodiments of the present disclosure includes a high-frequency switch, at least one first filter, at least one second filter, at least one first circuit, and at least one second circuit. The high-frequency switch has an antenna-side terminal and a plurality of filter-side terminals, and selectively connects one of the plurality of filter-side terminals to the antenna-side terminal. The first filter includes a plurality of filters having characteristics different from each other, and has a common terminal common to the plurality of filters. The second filter includes a single filter. The first circuit connects a first terminal in the plurality of filter-side terminals to the first filter. The second circuit connects a second terminal in the plurality of filter-side terminals to one end terminal of the second filter. A signal transmission distance of the first circuit is shorter than a signal transmission distance of the second circuit.

In this configuration, a signal transmission distance between the first filter and the high-frequency switch, in which insertion loss is likely to be large, is shorter than a signal transmission distance between the second filter and the high-frequency switch. This reduces the insertion loss for a high-frequency signal in a communication band that is transmitted through the first circuit. On the other hand, since the insertion loss of the second filter itself is originally small for a high-frequency signal in a communication band that is transmitted through the second circuit, influence on transmission loss of the high-frequency module is small, even when a signal transmission distance of the second circuit is made longer than a signal transmission distance of the first circuit. Thus, the transmission characteristics of the high-frequency module are improved.

In addition, the high-frequency module according to preferred embodiments of the present disclosure may have the following configuration. The at least one first filter includes a plurality of first filters and the at least one second filter includes a plurality of second filters. The at least one first circuit includes a plurality of first circuits and the at least one second circuit includes a plurality of second circuits. A signal transmission distance of a first circuit which is longest in the plurality of first circuits is shorter than a signal transmission distance of a second circuit which is shortest in the plurality of second circuits.

In this configuration, in a case where the plurality of first circuits and the plurality of second circuits are provided, the transmission characteristics of the high-frequency module are more reliably improved.

In addition, the high-frequency module according to preferred embodiments of the present disclosure may have the following configuration. The plurality of filters having characteristics different from each other and constituting the first filter perform filtering of a high-frequency signal in each of a plurality of communication bands in which communication is performed simultaneously.

In this configuration, the plurality of filters constituting the first filter transmits high-frequency signals in a plurality of communication bands that are targets of simultaneous communication in carrier aggregation. That is, the transmission characteristics of the high-frequency module are improved while the carrier aggregation is realized.

In addition, the high-frequency module according to preferred embodiments of the present disclosure preferably has the following configuration. A frequency band of a second communication band in which filtering is performed by the second filter is higher in frequency than a frequency band of a first communication band in which filtering is performed by the first filter.

In this configuration, a communication band in a high frequency band in which impedance matching is not relatively easy is assigned to the second circuit, and a communication band in a low frequency band for which design for impedance matching is easy to perform is assigned to the first circuit. Accordingly, it is possible to balance transmission characteristics of the respective communication bands, thereby suppressing the deterioration in the transmission characteristics of the high-frequency module. In other words, the transmission characteristics of the high-frequency module are improved, compared to an aspect in which this configuration is not used.

In addition, the high-frequency module according to preferred embodiments of the present disclosure preferably has the following configuration. The high-frequency module includes a base body on which the high-frequency switch, the first filter, and the second filter are mounted. The second filter is disposed at a position further from the switch than the first filter.

In this configuration, it is possible to realize a configuration in which the first circuit is shorter than the second circuit by an easy structure.

In addition, the high-frequency module according to preferred embodiments of the present disclosure preferably has the following configuration. The base body has a first surface and a second surface opposed to each other. The first filter and the second filter are mounted on the first surface. The high-frequency switch is mounted on the second surface. In plan view of the base body, the first filter and the high-frequency switch overlap with each other, and the second filter and the high-frequency switch do not overlap with each other.

In this configuration, in a configuration of double-sided mounting, a configuration in which the first circuit is shorter than the second circuit is enabled by an easy structure. Further, using the double-sided mounting makes it easy to reduce a planar area of the high-frequency module.

In addition, in the high-frequency module according to preferred embodiments of the present disclosure, in plan view of the base body, it is preferable that the second terminal of the high-frequency switch be disposed closer to an outer edge side of the high-frequency switch than the first terminal.

In this configuration, a length of the second circuit in the base body can be shortened, while the relationship between the first circuit and the second circuit described above is maintained, thereby facilitating impedance matching for a high-frequency signal transmitted through the second circuit.

In addition, the high-frequency module according to preferred embodiments of the present disclosure preferably has the following configuration. When the at least one second filter includes a plurality of second filters, in plan view of the base body, the second terminal to which a third filter for performing filtering in a communication band having a highest frequency in the plurality of second filters is connected, is disposed closer to an outer edge side of the high-frequency switch than the second terminal to which a filter other than the third filter in the plurality of second filters is connected.

In this configuration, a transmission distance of a high-frequency signal in the communication band having the highest frequency can be shortened. This facilitates impedance matching for the high-frequency signal, thereby suppressing transmission loss.

In addition, in the high-frequency module according to preferred embodiments of the present disclosure, it is preferable that, in plan view of a base body, the antenna-side terminal of the high-frequency switch be disposed closer to a center side of the high-frequency switch than the first terminal and the second terminal.

In this configuration, the respective distances between the antenna-side terminal and the first terminal, and the second terminal of the high-frequency switch are short. This, for example, even when an insertion loss requirement is strict in the second terminal, makes it easy to satisfy the requirement.

In addition, the high-frequency module according to preferred embodiments of the present disclosure preferably has the following configuration. The high-frequency module includes a composite device, a first matching element, a second matching element, and the base body. The composite device is formed with the high-frequency switch and a LNA, and has a substantially rectangular shape in plan view. The first matching element is connected between the high-frequency switch and the first filter or the second filter. The second matching element is connected between the first filter or the second filter and the LNA. The base body includes a first main surface and a second main surface opposed to each other. The first matching element, the second matching element, the first filter, and the second filter are mounted on the first main surface, and the composite device is mounted on the second main surface. The base body has a substantially rectangular shape in plan view. The composite device is mounted on the base body such that a side surface of the composite device forms a predetermined angle with a side surface of the base body.

In this configuration, it is possible to increase a distance between a terminal of the composite device and a mounting terminal of the base body, without increasing in size of a shape of the base body. Further, a positional relationship between the first matching element and the second matching element can be appropriately set.

In addition, the high-frequency module according to preferred embodiments of the present disclosure preferably has the following configuration. The LNA is formed at a corner portion of the composite device, and the high-frequency switch is formed at a central portion of the composite device. A LNA terminal connected to the LNA is formed at the corner portion of the composite device. The second matching element is mounted near the corner portion of the composite device in plan view of the base body. The first matching element is mounted at a position close to a formation region of the high-frequency switch in plan view of the base body.

In this configuration, a distance between the LNA and the first matching element can be shortened, and a distance between the first matching element and the second matching element can be increased.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

First Embodiment

Figure 1:
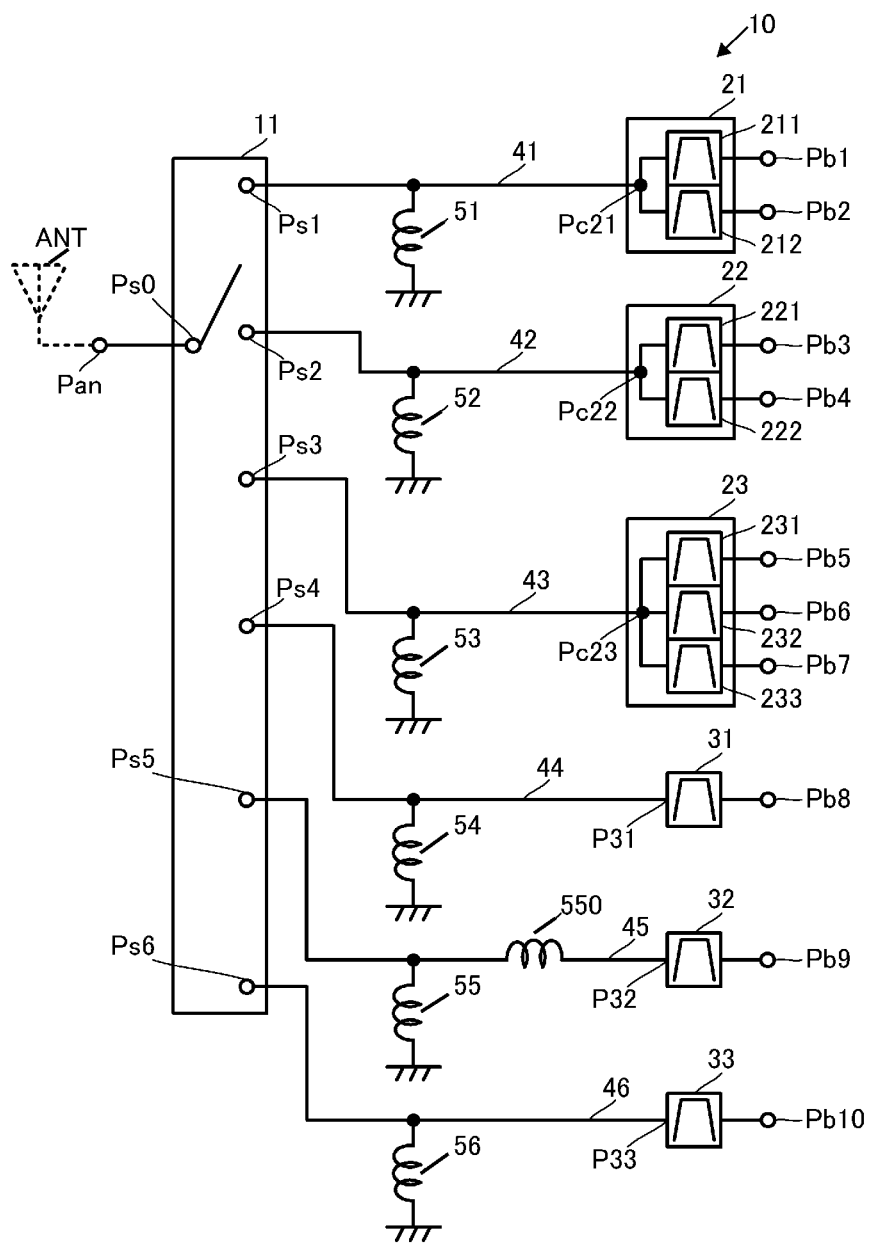
FIG. 1 is a circuit diagram of a high-frequency module according to a first embodiment of the present disclosure.

A high-frequency module according to a first embodiment of the present disclosure will be described with reference to the drawings. FIG. 1 is a circuit diagram of a high-frequency module 10 according to the first embodiment of the present disclosure.

Circuit Configuration

The high-frequency module 10 according to the first embodiment has a circuit for receiving downlink high-frequency signals in a plurality of communication bands. However, a configuration described below is also applicable to a circuit for transmitting an uplink high-frequency signal, and is also applicable to a circuit for transmitting an uplink high-frequency signal and receiving a downlink high-frequency signal.

As illustrated in FIG. 1, the high-frequency module 10 includes a high-frequency switch 11, a filter 21, a filter 22, a filter 23, a filter 31, a filter 32, a filter 33, a connection circuit 41, a connection circuit 42, a connection circuit 43, a connection circuit 44, a connection circuit 45, and a connection circuit 46. The high-frequency module 10 further includes a matching element 51, a matching element 52, a matching element 53, a matching element 54, a matching element 55, a matching element 56, and a matching element 550. The high-frequency module 10 further includes a terminal Pan, a terminal Pb1, a terminal Pb2, a terminal Pb3, a terminal Pb4, a terminal Pb5, a terminal Pb6, a terminal Pb7, a terminal Pb8, a terminal Pb9, and a terminal Pb10.

The filter 21, the filter 22, and the filter 23 each correspond to a "first filter" of the present disclosure, and the filter 31, the filter 32, and the filter 33 each correspond to a "second filter" of the present disclosure. The connection circuit 41, the connection circuit 42, and the connection circuit 43 each correspond to a "first circuit" of the present disclosure, and the connection circuit 44, the connection circuit 45, and the connection circuit 46 each correspond to a "second circuit" of the present disclosure.

The high-frequency switch 11 is a so-called SPnT (n=6) type switch. The high-frequency switch 11 is formed, for example, by using a semiconductor. The high-frequency switch 11 includes one antenna-side terminal Ps0, and a plurality of filter-side terminals Ps1, Ps2, Ps3, Ps4, Ps5, and Ps6. The high-frequency switch 11 selectively connects any one of the terminal Ps1, the terminal Ps2, the terminal Ps3, the terminal Ps4, the terminal Ps5, and the terminal Ps6 to the terminal Ps0. Note that the high-frequency switch 11 may include a plurality of antenna-side terminals. Further, an aspect may be adopted in which only one of the filter-side terminals is selected, or an aspect may be adopted in which a plurality of filter-side terminals is selected.

The terminal Ps0 of the high-frequency switch 11 is connected to the terminal Pan, and the terminal Pan is connected to an antenna ANT outside the high-frequency module 10.

The terminals Ps1, Ps2, Ps3, Ps4, Ps5, and Ps6 of the high-frequency switch 11 are connected to the filter 21, the filter 22, the filter 23, the filter 31, the filter 32, and the filter 33, respectively. More specifically, the terminal Ps1 is connected to the filter 21 via the connection circuit 41. The terminal Ps2 is connected to the filter 22 via the connection circuit 42. The terminal Ps3 is connected to the filter 23 via the connection circuit 43. The terminal Ps4 is connected to the filter 31 via the connection circuit 44. The terminal Ps5 is connected to the filter 32 via the connection circuit 45. The terminal Ps6 is connected to the filter 33 via the connection circuit 46.

Each of the filter 21, the filter 22, the filter 23, the filter 31, the filter 32, and the filter 33 is a filter using, for example, a SAW resonator or the like.

The filter 21 includes a filter 211 and a filter 212. Each of the filter 211 and the filter 212 is a filter that transmits a high-frequency signal in one communication band, and attenuates high-frequency signals in other communication bands. That is, the filter 211 and the filter 212 are each a single filter. A pass band of the filter 211 and a pass band of the filter 212 are different from each other.

One terminal of the filter 211 is connected to one terminal of the filter 212, and this connection point is a common terminal Pc21 of the filter 21. That is, the filter 21 is a multiplexer constituted by a plurality of filters.

The common terminal Pc21 of the filter 21 is connected to the connection circuit 41. Another terminal of the filter 211 is connected to the terminal Pb1 of the high-frequency module 10, and another terminal of the filter 212 is connected to the terminal Pb2 of the high-frequency module 10.

The filter 22 includes a filter 221 and a filter 222. Each of the filter 221 and the filter 222 is a filter that transmits a high-frequency signal in one communication band, and attenuates high-frequency signals in other communication bands. That is, the filter 221 and the filter 222 are each a single filter. A pass band of the filter 221 is different from a pass band of the filter 222.

One terminal of the filter 221 is connected to one terminal of the filter 222, and this connection point is a common terminal Pc22 of the filter 22. That is, the filter 22 is a multiplexer constituted by a plurality of filters.

The common terminal Pc22 of the filter 22 is connected to the connection circuit 42. Another terminal of the filter 221 is connected to the terminal Pb3 of the high-frequency module 10, and another terminal of the filter 222 is connected to the terminal Pb4 of the high-frequency module 10.

The filter 23 includes a filter 231, a filter 232, and a filter 233. Each of the filter 231, the filter 232, and the filter 233 is a filter that transmits a high-frequency signal in one communication band, and attenuates high-frequency signals in other communication bands. That is, the filter 231, the filter 232, and the filter 233 are each a single filter. A pass band of the filter 231, a pass band of the filter 232, and a pass band of the filter 233 are different from each other.

One terminal of the filter 231, one terminal of the filter 232, and one terminal of the filter 233 are connected to each other, and this connection point is a common terminal Pc23 of the filter 23. That is, the filter 23 is a multiplexer constituted by a plurality of filters.

The common terminal Pc23 of the filter 23 is connected to the connection circuit 43. Another terminal of the filter 231 is connected to the terminal Pb5 of the high-frequency module 10, another terminal of the filter 232 is connected to the terminal Pb6 of the high-frequency module 10, and another terminal of the filter 233 is connected to the terminal Pb7 of the high-frequency module 10.

The filter 31 is a filter that transmits a high-frequency signal in one communication band, and attenuates high-frequency signals in other communication bands. One terminal P31 of the filter 31 is connected to the connection circuit 44, and another terminal of the filter 31 is connected to the terminal Pb8 of the high-frequency module 10.

The filter 32 is a filter that transmits a high-frequency signal in one communication band, and attenuates high-frequency signals in other communication bands. One terminal P32 of the filter 32 is connected to the connection circuit 45, and another terminal of the filter 32 is connected to the terminal Pb9 of the high-frequency module 10.

The filter 33 is a filter that transmits a high-frequency signal in one communication band, and attenuates high-frequency signals in other communication bands. One terminal P33 of the filter 33 is connected to the connection circuit 46, and another terminal of the filter 33 is connected to the terminal Pb10 of the high-frequency module 10.

The matching element 51 is connected between the connection circuit 41 and ground potential, the matching element 52 is connected between the connection circuit 42 and the ground potential, and the matching element 53 is connected between the connection circuit 43 and the ground potential. The matching element 54 is connected between the connection circuit 44 and the ground potential, the matching element 55 is connected between the connection circuit 45 and the ground potential, and the matching element 56 is connected between the connection circuit 46 and the ground potential. The matching element 550 is disposed in series in the connection circuit 45.

For example, the respective communication bands described below are assigned to the filter 21, filter 22, filter 23, filter 31, filter 32, and filter 33 in the high-frequency module 10 having the above-described configuration. Note that, communication band names below indicate, as an example, communication band names of the Long Term Evolution (LTE) standards. Further, the following assignment is an example, and another example may be adopted.

A pass band of the filter 211 in the filter 21 is assigned with communication band B25 (1930 MHz to 1995 MHz), and a pass band of the filter 212 is assigned with communication band B66 (2110 MHz to 2200 MHz). These are combinations of communication bands that are targets of simultaneous communication in carrier aggregation.

A pass band of the filter 221 in the filter 22 is assigned with communication band B34 (2010 MHz to 2025 MHz), and a pass band of the filter 222 is assigned with communication band B39 (1880 MHz to 1920 MHz). These are combinations of communication bands that are targets of simultaneous communication in the carrier aggregation.

A pass band of the filter 231 in the filter 23 is assigned with communication band B1 (2110 MHz to 2170 MHz), a pass band of the filter 232 is assigned with communication band B3 (1805 MHz to 1880 MHz), and a pass band of the filter 233 is assigned with communication band B40 (2300 MHz to 2400 MHz). These are combinations of communication bands that are targets of simultaneous communication in the carrier aggregation.

A pass band of the filter 31 is assigned with communication band B30 (2350 MHz to 2360 MHz). A pass band of the filter 32 is assigned with communication band B41 (2496 MHz to 2690 MHz). A pass band of the filter 33 is assigned with communication band B7 (2620 MHz to 2690 MHz).

With the above configuration, the high-frequency module 10 in which the carrier aggregation can be selected is enabled with a simple configuration. Further, the high-frequency module 10 has a structure described later, and thereby, it is possible to improve transmission characteristics. That is, it is possible to realize the high-frequency module 10 excellent in the transmission characteristics, while enabling the carrier aggregation.

Note that, it is preferable to assign a communication band in a frequency band (MH band) lower than about 2.5 GHz to each of the filter 21, the filter 22, and the filter 23 each being the multiplexer, and to assign a communication band in a frequency band (H band) equal to or higher than about 2.5 GHz to each of the filter 31, the filter 32, and the filter 33 each being the single filter. This is because impedance matching between filters forming a multiplexer and the high-frequency switch 11 is more difficult in a higher frequency band. Thus, by using the configuration in which the pass bands are assigned as described above, it is possible to suppress insertion loss in each of the filters forming the multiplexer, thereby suppressing the deterioration in the transmission characteristics of the high-frequency module 10. In other words, it is possible to improve the transmission characteristics of the high-frequency module 10.

Further, the present disclosure is not limited to an aspect in which a plurality of filters forming a multiplexer is provided in a single housing, but an aspect may be adopted in which different housings each provided with filters are connected to each other with wiring lines on a substrate.

Structure

Figure 2A:
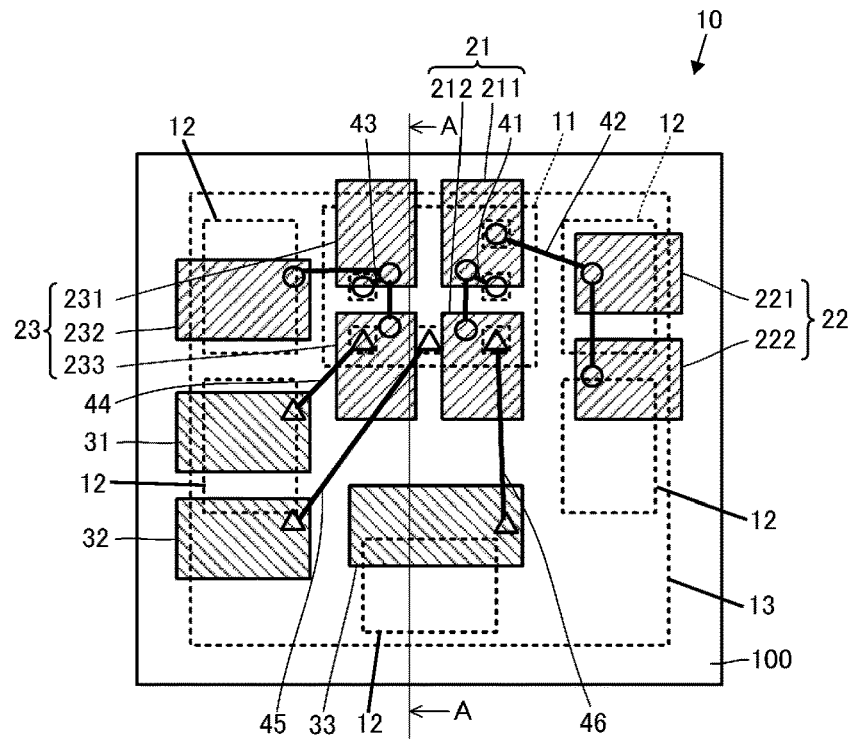
FIG. 2A is a plan view illustrating a configuration of the high-frequency module according to the first embodiment of the present disclosure.
Figure 2B:
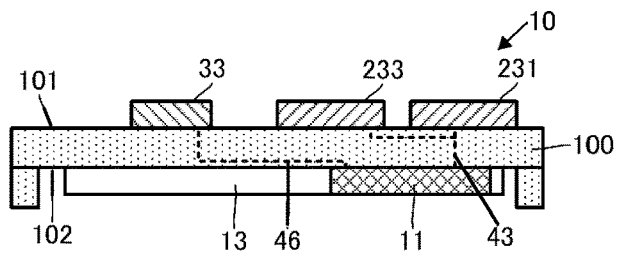
FIG. 2B is a sectional view taken along a line A-A in FIG. 2A.
Figure 3:
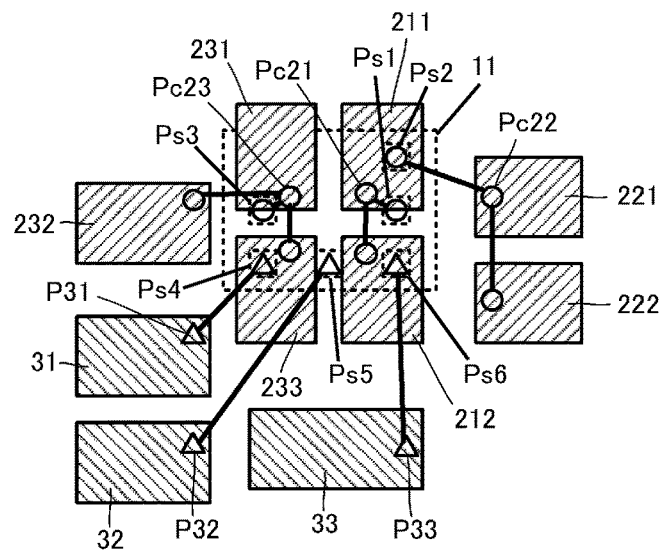
FIG. 3 is a plan view illustrating an arrangement relation of terminals of the high-frequency module according to the first embodiment of the present disclosure.

FIG. 2A is a plan view illustrating a configuration of the high-frequency module 10 according to the first embodiment of the present disclosure, and FIG. 2B is a sectional view taken along the line A-A in FIG. 2A. FIG. 3 is a plan view illustrating an arrangement relation of the terminals of the high-frequency module 10 according to the first embodiment of the present disclosure.

As illustrated in FIG. 2A and FIG. 2B, the high-frequency module 10 includes a base body 100. The base body 100 is mainly formed of an insulating substrate, and has a main surface 101 and a main surface 102 parallel and opposed to each other. The base body 100 includes the main surface 101 and the main surface 102, and includes a conductor pattern for realizing a circuit of the high-frequency module 10 illustrated in FIG. 1 inside thereof. Note that, the main surface 101 corresponds to a "first surface" of the present disclosure, and the main surface 102 corresponds to a "second surface" of the present disclosure.

The filter 211 and the filter 212 constituting the filter 21, each individually have a body. The filter 221 and the filter 222 constituting the filter 22, each individually have a body. The filter 231, the filter 232, and the filter 233 constituting the filter 23, each individually have a body.

The filter 211, the filter 212, the filter 221, the filter 222, the filter 231, the filter 232, and the filter 233 are mounted on the main surface 101 of the base body 100.

The high-frequency switch 11 is realized by a composite device 13 integrally formed with a plurality of LNAs 12. The composite device 13 has a formation region for the high-frequency switch 11, and formation regions for the plurality of LNAs 12. The high-frequency switch 11 is formed in a vicinity of one side surface of the composite device 13.

The composite device 13 is mounted on the main surface 102 of the base body 100.

As illustrated in FIG. 2A, in plan view of the high-frequency module 10, the high-frequency switch 11 overlaps with the filter 211 and the filter 212. The high-frequency switch 11 overlaps with the filter 231 and the filter 233. That is, the high-frequency switch 11 overlaps with the multiplexer type filter 21 and the multiplexer type filter 23.

Further, the high-frequency switch 11 does not overlap with the filter 31, the filter 32, and the filter 33.

With this configuration, in plan view, compared to a physical distance between the high-frequency switch 11 and the filter 31, a physical distance between the high-frequency switch 11 and the filter 32, and a physical distance between the high-frequency switch 11 and the filter 33, a physical distance between the high-frequency switch 11 and the filter 21, and a physical distance between the high-frequency switch 11 and the filter 23 are made short. Thus, compared to the respective lengths of the connection circuit 44, the connection circuit 45, and the connection circuit 46, the respective lengths of signal transmission paths of the connection circuit 41 and the connection circuit 43 are made short.

Accordingly, compared to a transmission distance of a high-frequency signal (electrical length of a high-frequency signal) between the high-frequency switch 11 and the filter 31, a transmission distance of a high-frequency signal between the high-frequency switch 11 and the filter 32, and a transmission distance of a high-frequency signal of the high-frequency switch 11 and the filter 33, a transmission distance of a high-frequency signal between the high-frequency switch 11 and the filter 21, and a transmission distance of a high-frequency signal between the high-frequency switch 11 and the filter 23 are made short.

Here, it is not easy to realize impedance matching in a multiplexer type filter, that is, a filter in which a plurality of filters are combined, for all the filters forming the multiplexer, and the realization is more difficult as a distance from the high-frequency switch 11 increases. However, in the high-frequency module 10, a transmission distance of a high-frequency signal between each of the filter 21 and the filter 23, which are of the multiplexer type, and the high-frequency switch 11 is short. Thus, it is possible to more reliably perform the impedance matching between the filter 21 and the filter 23, which are of the multiplexer type, and the high-frequency switch 11.

On the other hand, for the filter 31, the filter 32, and the filter 33 that are the single filters, impedance matching is easily performed compared to the multiplexer type filters, even when the respective transmission distances of a high-frequency signal to the high-frequency switch 11 are long. Thus, the high-frequency module 10 can also more reliably perform the impedance matching between the filter 31, the filter 32, the filter 33, and the high-frequency switch 11.

Accordingly, in the configuration including the multiplexer type filter and the single filter, the high-frequency module 10 can realize excellent transmission characteristics.

Additionally, in the high-frequency module 10, as illustrated in FIG. 3, in plan view, compared to a distance between the terminal P31 of the filter 31 being the single filter and the terminal Ps4 of the high-frequency switch 11, a distance between the terminal P32 of the filter 32 being the single filter and the terminal Ps5 of the high-frequency switch 11, and a distance between the terminal P33 of the filter 33 being the single filter and the terminal Ps6 of the high-frequency switch 11, a distance between the common terminal Pc21 of the multiplexer type filter 21 and the terminal Ps1 of the high-frequency switch 11, a distance between the common terminal Pc22 of the multiplexer type filter 22 and the terminal Ps2 of the high-frequency switch 11, and a distance between the common terminal Pc23 of the multiplexer type filter 23 and the terminal Ps3 of the high-frequency switch 11 are short.

Accordingly, compared to a transmission distance of a high-frequency signal (electrical length of a high-frequency signal) between the high-frequency switch 11 and the filter 31, a transmission distance of a high-frequency signal between the high-frequency switch 11 and the filter 32, and a transmission distance of a high-frequency signal between the high-frequency switch 11 and the filter 33, a transmission distance of a high-frequency signal between the high-frequency switch 11 and the filter 21, a transmission distance of a high-frequency signal between the high-frequency switch 11 and the filter 22, and a transmission distance of a high-frequency signal between the high-frequency switch 11 and the filter 23 are made short.

Accordingly, in the configuration including the multiplexer type filter and the single filter, the high-frequency module 10 can more reliably realize excellent transmission characteristics.

Note that, in the high-frequency module 10, a length of a signal transmission distance of the connection circuit for each of the multiplexer type filters is made shorter than a length of a signal transmission distance of the connection circuit for each of the single filters. In other words, the longest distance among signal transmission distances of the connection circuits for all the multiplexer type filters is shorter than the shortest distance among signal transmission distances of the connection circuits for all the single filters. This is a preferred aspect, but in accordance with a performance requirement for the high-frequency module 10, a length of a signal transmission distance of a connection circuit for at least one of the multiplexer type filters may be shorter than a length of a signal transmission distance of the connection circuit for the single filter.

In addition, in the high-frequency module 10, the plurality of filters 21, 22, 23, 31, 32, and 33 are mounted on the main surface 101 of the base body 100, and the high-frequency switch 11 is mounted on the main surface 102 of the base body 100. Accordingly, a planar area of the high-frequency module 10 decreases. That is, it is possible to realize the high-frequency module 10 further reduced in size.

Further, in the high-frequency module 10, as illustrated in FIG. 2A and FIG. 2B, the connection circuit 41 to the filter 21, the connection circuit 42 to the filter 22, the connection circuit 43 to the filter 23, the connection circuit 44 to the filter 31, the connection circuit 45 to the filter 32, and the connection circuit 46 to the filter 33 do not overlap with each other in plan view. Accordingly, the electromagnetic coupling between the connection circuits can be suppressed, thereby realizing further excellent transmission characteristics.

Second Embodiment

Figure 4:
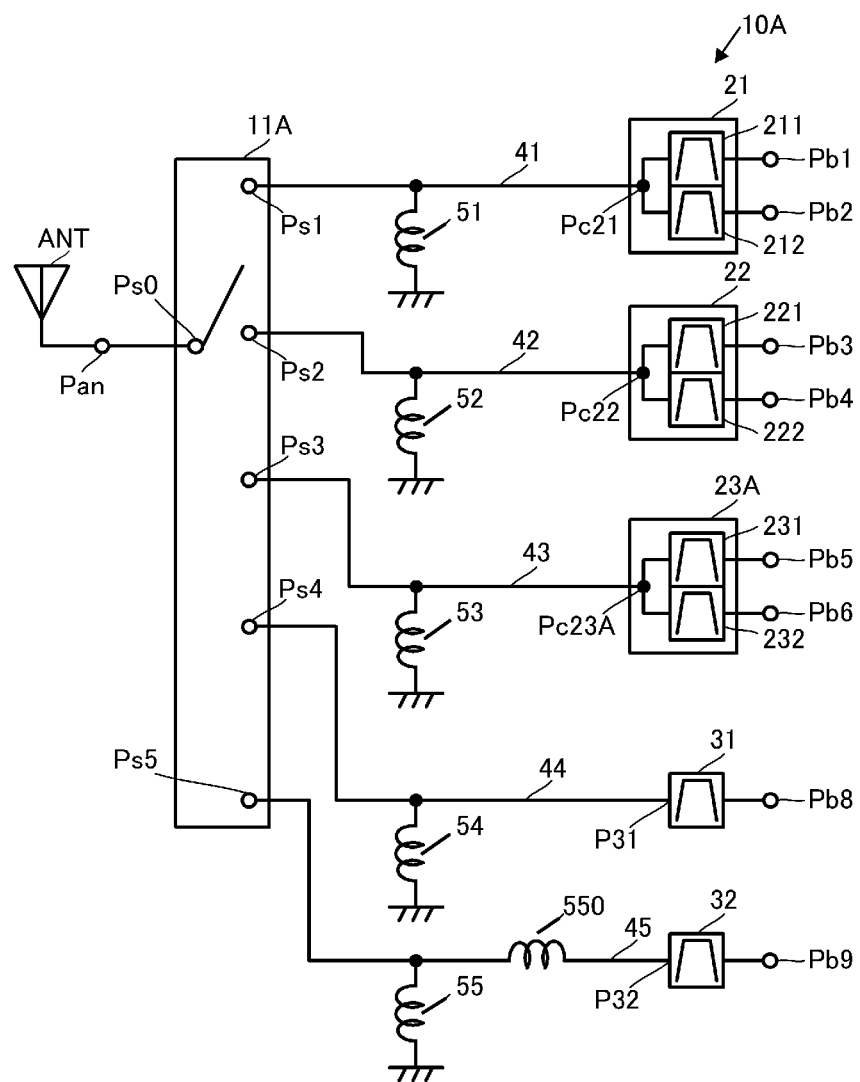
FIG. 4 is a circuit diagram of a high-frequency module according to a second embodiment of the present disclosure.

Next, a high-frequency module according to a second embodiment of the present disclosure will be described with reference to the drawings. FIG. 4 is a circuit diagram of a high-frequency module 10A according to the second embodiment of the present disclosure.
Circuit Configuration As a circuit configuration, as illustrated in FIG. 4, the high-frequency module 10A according to the second embodiment differs from the high-frequency module 10 according to the first embodiment in a configuration of a filter 23A. Further, in the high-frequency module 10A, the filter 33 is omitted, compared to the high-frequency module 10. Accordingly, in the high-frequency switch 11A, the terminal Ps6 is omitted, compared to the high-frequency switch 11. Other basic configuration of the high-frequency module 10A is similar to that of the high-frequency module 10, and the description of similar parts will be omitted.

The high-frequency switch 11A includes the terminal Ps0, the terminal Ps1, the terminal Ps2, the terminal Ps3, the terminal Ps4, and the terminal Ps5. The high-frequency switch 11A selectively connects any one of the terminal Ps1, the terminal Ps2, the terminal Ps3, the terminal Ps4, and the terminal Ps5 to the terminal Ps0.

The filter 23A includes the filter 231 and the filter 232. The filter 231 is connected to the filter 232, and this connection point is a common terminal Pc23A of the filter 23A. The common terminal Pc23A is connected to the terminal Ps3 of the high-frequency switch 11A via the connection circuit 43.
Structure FIG. 5A is a plan view illustrating a configuration of the high-frequency module 10A according to the second embodiment of the present disclosure, and FIG. 5B is a sectional view taken along the line B-B in FIG. 5A.

Figure 5A:
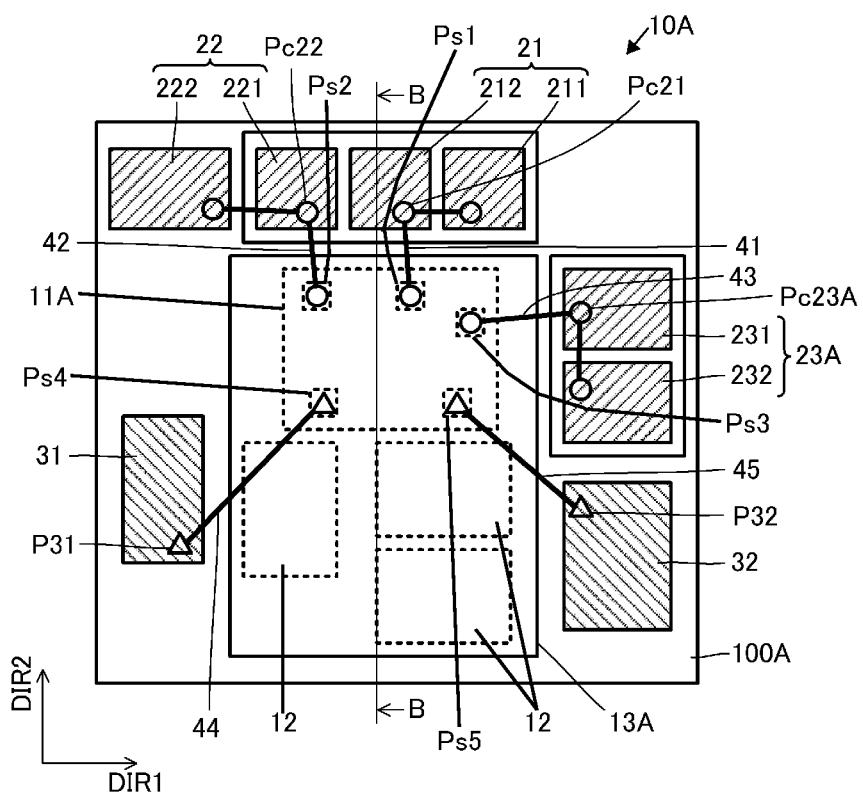
FIG. 5A is a plan view illustrating a configuration of the high-frequency module according to the second embodiment of the present disclosure.
Figure 5B:
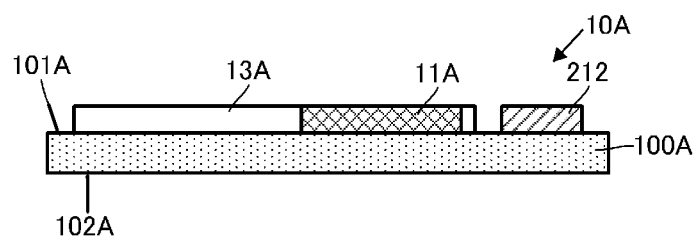
FIG. 5B is a sectional view taken along a line B-B in FIG. 5A.

As illustrated in FIG. 5A and FIG. 5B, the high-frequency module 10A is schematically different from the high-frequency module 10 in that the components are mounted on one of main surfaces.

The high-frequency module 10A includes a base body 100A. The base body 100A includes a main surface 101A and a main surface 102A that are parallel and opposed to each other.

A composite device 13A including the high-frequency switch 11A is mounted on the main surface 101A of the base body 100A. The filter 211, the filter 212, the filter 221, the filter 222, the filter 231, the filter 232, the filter 31, and the filter 32 are mounted on the main surface 101A of the base body 100A. At this time, the filter 211, the filter 212, and the filter 221 are integrally formed in one housing. The filter 231 and the filter 232 are integrally formed in one housing.

The composite device 13A is mounted at a center of the main surface 101A in a first direction DIR 1. Further, the composite device 13A is mounted such that the high-frequency switch 11A is disposed in a vicinity of one end side in a second direction DIR 2 on the main surface 101A, and the LNA 12 is disposed on another end side.

The filter 211, the filter 212, the filter 221, the filter 222, the filter 231, and the filter 232 are mounted at positions closer to the one end side than the other end side in the second direction DIR 2 on the main surface 101A.

The filter 31 and the filter 32 are mounted at positions closer to the other end side than the one end side in the second direction DIR 2 on the main surface 101A.

With such a configuration, the filter 211, the filter 212, the filter 221, the filter 222, the filter 231, and the filter 232 are physically closer to the high-frequency switch 11A than the filter 31 and the filter 32.

Further, as illustrated in FIG. 5A, a distance between the terminal Ps1 of the high-frequency switch 11A and the common terminal Pc21 of the filter 21, a distance between the terminal Ps2 of the high-frequency switch 11A and the common terminal Pc22 of the filter 22, and a distance between the terminal Ps3 of the high-frequency switch 11A and the common terminal Pc23A of the filter 23A are shorter than a distance between the terminal Ps4 of the high-frequency switch 11A and the terminal P31 of the filter 31, and a distance between the terminal Ps5 of the high-frequency switch 11A and the terminal P32 of the filter 32.

Accordingly, compared to a transmission distance of a high-frequency signal between the high-frequency switch 11A and the filter 31 (electrical length of a high-frequency signal), and a transmission distance of a high-frequency signal between the high-frequency switch 11A and the filter 32, a transmission distance of a high-frequency signal between the high-frequency switch 11A and the filter 21, a transmission distance of a high-frequency signal between the high-frequency switch 11A and the filter 22, and a transmission distance of a high-frequency signal between the high-frequency switch 11A and the filter 23A are shorter.

Accordingly, in the configuration including the multiplexer type filter and the single filter, the high-frequency module 10A can more reliably realize excellent transmission characteristics.

Third Embodiment

Figure 6A:
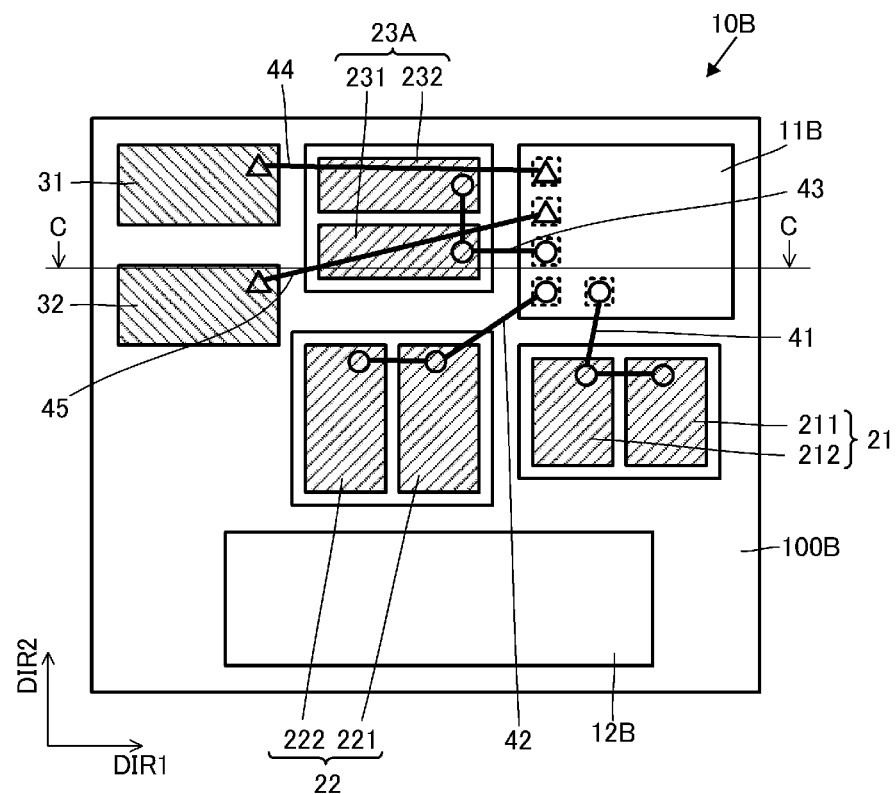
FIG. 6A is a plan view illustrating a configuration of a high-frequency module according to a third embodiment of the present disclosure.

Next, a high-frequency module according to a third embodiment of the present disclosure will be described with reference to the drawings. FIG. 6A is a plan view illustrating a configuration of a high-frequency module 10B according to the third embodiment of the present disclosure, and FIG. 6B is a sectional view taken along the line C-C in FIG. 6A.

Figure 6B:
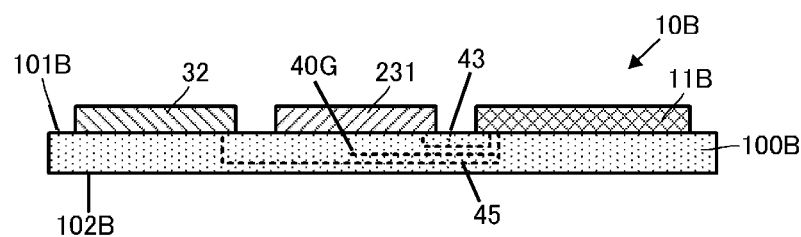
FIG. 6B is a sectional view taken along a line C-C in FIG. 6A.

As illustrated in FIG. 6A and FIG. 6B, the high-frequency module 10B according to the third embodiment differs from the high-frequency module 10A according to the second embodiment in that a high-frequency switch 11B is isolated from a LNA 12B and in the arrangement in mounting. Other basic configuration including a circuit configuration of the high-frequency module 10B is similar to that of the high-frequency module 10A, and the description of similar parts will be omitted.

The high-frequency module 10B includes a base body 100B, the high-frequency switch 11B, and the LNA 12B.

The base body 100B includes a main surface 101B and a main surface 102B that are parallel and opposed to each other.

The high-frequency switch 11B and the LNA 12B are different from each other and each have an individual housing. The high-frequency switch 11B and the LNA 12B are mounted on the main surface 100B of the base body 101B.

The high-frequency switch 11B is mounted near one end in the first direction DIR 1, and near one end in the second direction DIR 2 on the main surface 101B. In other words, the high-frequency switch 11B is mounted in a vicinity of one corner portion on the main surface 101B.

The LNA 12B is mounted near another end in the second direction DIR 2.

The filter 211, the filter 212, the filter 221, the filter 222, the filter 231, the filter 232, the filter 31, and the filter 32 are mounted on the main surface 101B of the base body 100B. At this time, the filter 211 and the filter 212 are integrally formed in one housing. The filter 221 and the filter 222 are integrally formed in one housing. The filter 231 and the filter 232 are integrally formed in one housing. That is, the filter 21, the filter 22, and the filter 23A are each formed in an individual housing.

The filter 211, the filter 212, the filter 221, the filter 222, the filter 231, and the filter 232 are mounted on the main surface 101B and adjacent to the high-frequency switch 11B so as to surround the high-frequency switch 11B.

The filter 31 and the filter 32 are disposed on a side opposite to a side where the high-frequency switch 11B is disposed, with the filter 221, the filter 222, the filter 231, and the filter 232 in between.

With such a configuration, the filter 211, the filter 212, the filter 221, the filter 222, the filter 231, and the filter 232 are physically closer to the high-frequency switch 11B than the filter 31 and the filter 32.

Further, as with the high-frequency module 10A, as illustrated in FIG. 6A, a distance between a terminal of the high-frequency switch 11B and a common terminal of each of the filter 21, the filter 22, and the filter 23A is shorter than a distance between a terminal of the high-frequency switch 11B and a terminal of each of the filter 31 and the filter 32.

Accordingly, compared to a transmission distance of a high-frequency signal between the high-frequency switch 11B and the filter 31, and a transmission distance of a high-frequency signal between the high-frequency switch 11B and the filter 32, a transmission distance of a high-frequency signal between the high-frequency switch 11B and the filter 21, a transmission distance of a high-frequency signal between the high-frequency switch 11B and the filter 22, and a transmission distance of a high-frequency signal between the high-frequency switch 11B and the filter 23A are made short.

Accordingly, in the configuration including the multiplexer type filter and the single filter, the high-frequency module 10B can more reliably realize excellent transmission characteristics.

Further, in the high-frequency module 10B, as illustrated in FIG. 6A, the connection circuit 43 and the connection circuit 45 overlap with each other in plan view. However, in the high-frequency module 10B, a ground conductor 40G is disposed between the connection circuit 43 and the connection circuit 45 inside the base body 100B. Accordingly, the high-frequency coupling between the connection circuit 43 and the connection circuit 45 is suppressed. Thus, the high-frequency module 10B can achieve excellent transmission characteristics. Note that, as illustrated in FIG. 6A, when the connection circuit 43 and the connection circuit 45 are disposed substantially orthogonal to each other, the high-frequency coupling is unlikely to occur, and thus, it is also possible to omit the ground conductor 40G.

Fourth Embodiment

Figure 7A:
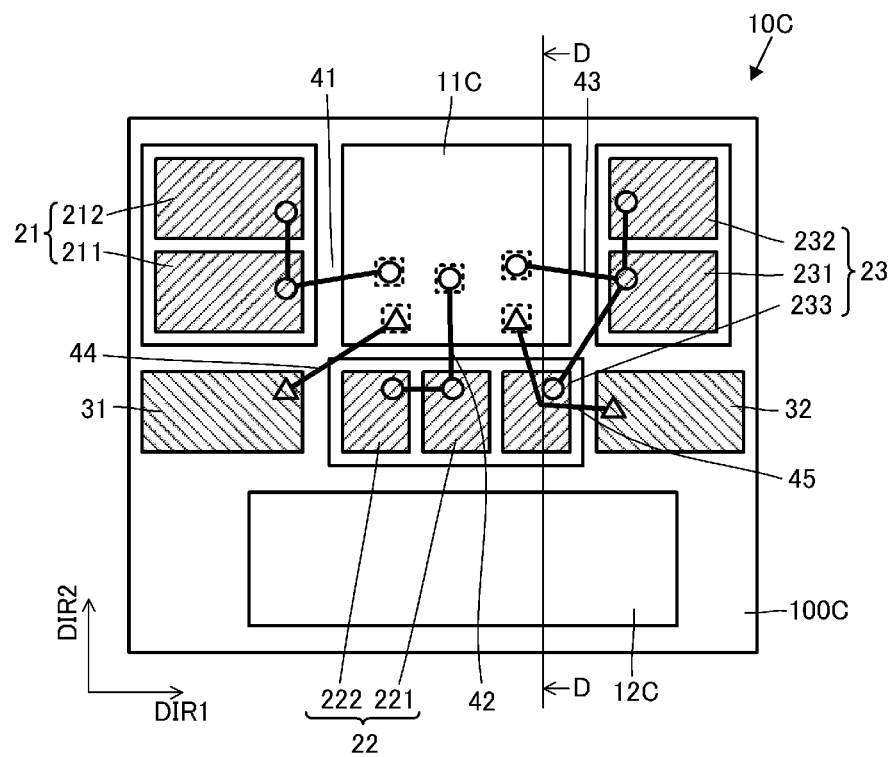
FIG. 7A is a plan view illustrating a configuration of a high-frequency module according to a fourth embodiment of the present disclosure.

Next, a high-frequency module according to a fourth embodiment of the present disclosure will be described with reference to the drawings. FIG. 7A is a plan view illustrating a configuration of the high-frequency module 10C according to the fourth embodiment of the present disclosure, and FIG. 7B is a sectional view taken along the line D-D in FIG. 7A.

Figure 7B:
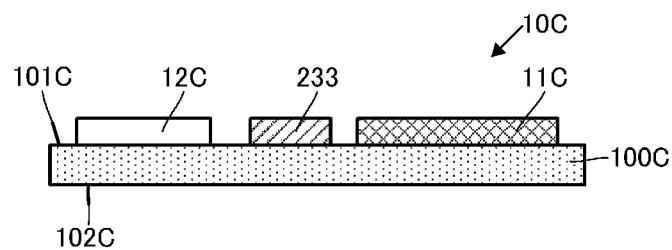
FIG. 7B is a sectional view taken along a line D-D in FIG. 7A.

As illustrated in FIG. 7A and FIG. 7B, the high-frequency module 10C according to the fourth embodiment schematically differs from the high-frequency module 10B according to the third embodiment in a positional relationship between a high-frequency switch 11C and each filter. Note that, a circuit configuration of the high-frequency module 10B is similar to that of the high-frequency module 10 according to the first embodiment. Other basic configuration of the high-frequency module 10C is similar to that of the high-frequency module 10B, and the description of similar parts will be omitted.

The high-frequency module 10C includes a base body 100C, the high-frequency switch 11C, and a LNA 12C. A basic configuration of the high-frequency switch 11C and a basic configuration of the LNA 12C are the same as those of the high-frequency switch 11B and the LNA 12B, respectively.

The base body 100C includes a main surface 101C and a main surface 102C that are parallel and opposed to each other.

The high-frequency switch 11C and the LNA 12C are mounted on the main surface 101C of the base body 100C.

The high-frequency switch 11C is mounted at a substantially center in the first direction DIR 1 on the main surface 101C, and near one end in the second direction DIR 2. The LNA 12C is mounted near another end in the second direction DIR 2.

The filter 211, the filter 212, the filter 221, the filter 222, the filter 231, the filter 232, the filter 233, the filter 31, and the filter 32 are mounted on the main surface 101C of the base body 100C. At this time, the filter 211 and the filter 212 are integrally formed in one housing. The filter 221, the filter 222, and the filter 233 are integrally formed in one housing. The filter 231 and the filter 232 are integrally formed in one housing.

The filter 211 and the filter 212 are disposed on another end side in the first direction DIR 1 relative to the high-frequency switch 11C. The filter 211 and the filter 212 are disposed along a side surface of the high-frequency switch 11C opposed to the filter 211 and the filter 212.

The filter 221, the filter 222, and the filter 233 are disposed on another end side (side where the LNA 12C is disposed) in the second direction DIR 2 relative to the high-frequency switch 11C. The filter 221, the filter 222, and the filter 233 are disposed along a side surface of the high-frequency switch 11C opposed to the filter 221, the filter 222, and the filter 233. The filter 233 is disposed on a side closer to the filter 231 than the filter 211 in the first direction DIR 1.

The filter 231 and the filter 232 are disposed on one end side in the first direction DIR 1 relative to the high-frequency switch 11C. The filter 231 and the filter 232 are disposed along a side surface of the high-frequency switch 11C opposed to the filter 231 and the filter 232.

As described above, in the high-frequency switch 11C, the three side surfaces thereof are surrounded by a first filter element constituted by a set of the filter 211 and the filter 212, a second filter element constituted by a set of the filter 221, the filter 222, and the filter 233, and a third filter element constituted by a set of the filter 231 and the filter 232.

The filter 31 and the filter 32 are disposed so as to be spaced apart from each other by a predetermined distance from the respective different corner portions of the high-frequency switch 11C.

With such a configuration, the filter 211, the filter 212, the filter 221, the filter 222, the filter 231, the filter 232, and the filter 233 are physically closer to the high-frequency switch 11C than the filter 31 and the filter 32 are.

Further, as illustrated in FIG. 7A, a distance between a terminal of the high-frequency switch 11C and a common terminal of the filter 21, a distance between a terminal of the high-frequency switch 11C and a common terminal of the filter 22, and a distance between a terminal of the high-frequency switch 11C and a common terminal of the filter 23 are shorter than a distance between a terminal of the high-frequency switch 11C and a terminal of the filter 31, and a distance between a terminal of the high-frequency switch 11C and a terminal of the filter 32.

Accordingly, compared to a transmission distance of a high-frequency signal between the high-frequency switch 11C and the filter 31, and a transmission distance of a high-frequency signal between the high-frequency switch 11C and the filter 32, a transmission distance of a high-frequency signal between the high-frequency switch 11C and the filter 21, a transmission distance of a high-frequency signal between the high-frequency switch 11C and the filter 22, and a transmission distance of a high-frequency signal between the high-frequency switch 11C and the filter 23 are made short.

Accordingly, in the configuration including the multiplexer type filter and the single filter, the high-frequency module 10C can more reliably realize excellent transmission characteristics.

Fifth Embodiment

Figure 8A:
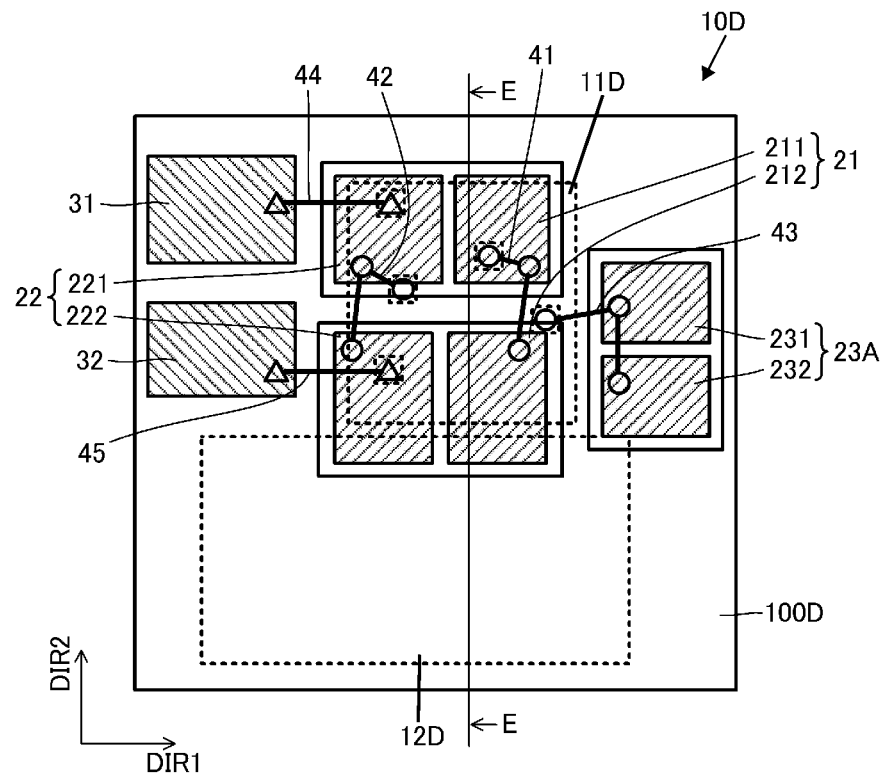
FIG. 8A is a plan view illustrating a configuration of a high-frequency module according to a fifth embodiment of the present disclosure.

Next, a high-frequency module according to a fifth embodiment of the present disclosure will be described with reference to the drawings. FIG. 8A is a plan view illustrating a configuration of the high-frequency module 10D according to the fifth embodiment of the present disclosure, and FIG. 8B is a sectional view taken along the line E-E in FIG. 8A.

Figure 8B:
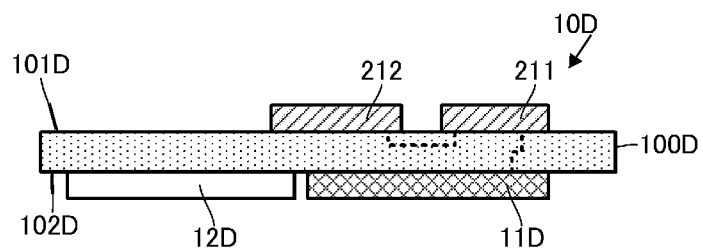
FIG. 8B is a sectional view taken along a line E-E in FIG. 8A.

As illustrated in FIG. 8A and FIG. 8B, the high-frequency module 10D according to the fifth embodiment is schematically different from the high-frequency module 10 according to the first embodiment in that a high-frequency switch 11D is isolated from a LNA 12D, and that a plurality of filters is integrally formed. Note that, a circuit configuration of the high-frequency module 10D is similar to that of the high-frequency module 10A according to the second embodiment. Other basic configuration of the high-frequency module 10D is similar to that of the high-frequency module 10, and the description of similar parts will be omitted.

As illustrated in FIG. 8A and FIG. 8B, the high-frequency module 10D includes a base body 100D. The base body 100D has a main surface 101D and a main surface 102D that are parallel and opposed to each other.

The filter 211, the filter 212, the filter 221, the filter 222, the filter 231, and the filter 232 are mounted on the main surface 101D of the base body 100D. At this time, the filter 211 and the filter 221 are integrally formed in one housing. The filter 212 and the filter 222 are integrally formed in one housing. The filter 231 and the filter 232 are integrally formed in one housing.

The high-frequency switch 11D and the LNA 12D are mounted on the main surface 102D of the base body 100D. The high-frequency switch 11D is disposed on the main surface 102D in a region from a center to one end side in the second direction DIR 2. The LNA 12D is disposed on the main surface 102D in a region from the center to another end side in the second direction DIR 2.

As illustrated in FIG. 8A, in plan view of the high-frequency module 10D, the high-frequency switch 11D overlaps with the filter 211 and the filter 212. The high-frequency switch 11D overlaps with the filter 221 and the filter 222.

Further, the high-frequency switch 11D does not overlap with the filter 31 and the filter 32.

With this configuration, in plan view, compared to a physical distance between the high-frequency switch 11D and the filter 31, and a physical distance between the high-frequency switch 11D and the filter 32, a physical distance between the high-frequency switch 11D and the filter 21, and a physical distance between the high-frequency switch 11D and the filter 22 are made short.

Further, as illustrated in FIG. 8A, a distance between a terminal of the high-frequency switch 11D and a common terminal of the filter 21, a distance between a terminal of the high-frequency switch 11D and a common terminal of the filter 22, and a distance between a terminal of the high-frequency switch 11D and a common terminal of the filter 23A are shorter than a distance between a terminal of the high-frequency switch 11D and a terminal of the filter 31, and a distance between a terminal of the high-frequency switch 11D and a terminal of the filter 32.

Accordingly, compared to a transmission distance of a high-frequency signal between the high-frequency switch 11D and the filter 31, and a transmission distance of a high-frequency signal between the high-frequency switch 11D and the filter 32, a transmission distance of a high-frequency signal between the high-frequency switch 11D and the filter 21, a transmission distance of a high-frequency signal between the high-frequency switch 11D and the filter 22, and a transmission distance of a high-frequency signal between the high-frequency switch 11D and the filter 23A are made short.

Accordingly, in the configuration including the multiplexer type filter and the single filter, the high-frequency module 10D can more reliably realize excellent transmission characteristics.

Sixth Embodiment

Figure 9:
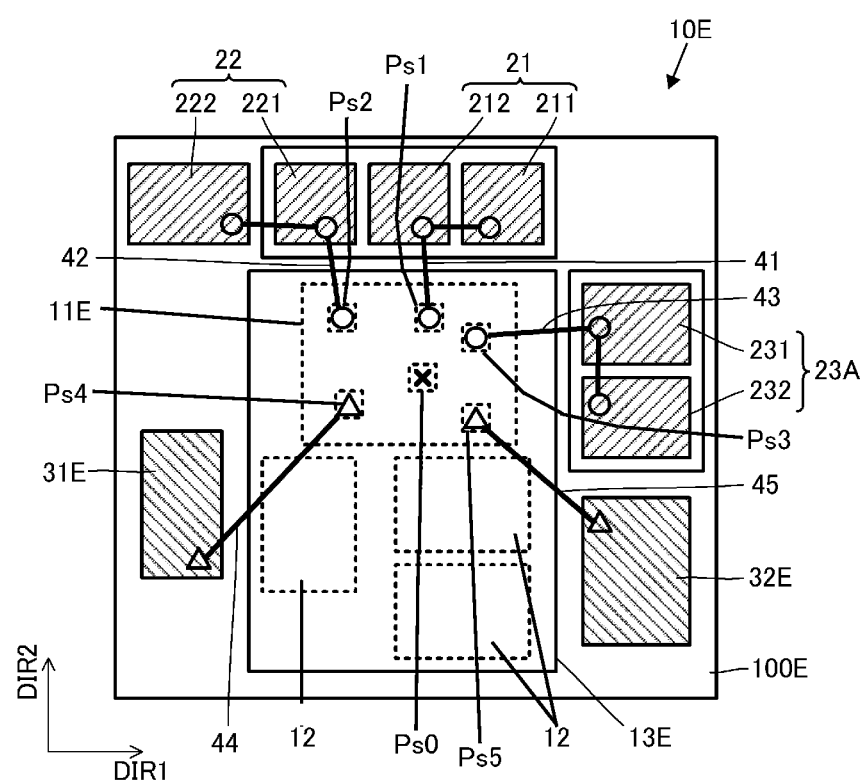
FIG. 9 is a plan view illustrating a configuration of a high-frequency module according to a sixth embodiment of the present disclosure.

Next, a high-frequency module according to a sixth embodiment of the present disclosure will be described with reference to the drawings. FIG. 9 is a plan view illustrating a configuration of a high-frequency module 10E according to the sixth embodiment of the present disclosure.

As illustrated in FIG. 9, the high-frequency module 10E according to the sixth embodiment differs from the high-frequency module 10A according to the second embodiment in an arrangement of terminals in a high-frequency switch 11E. Other configuration of the high-frequency module 10E is similar to that of the high-frequency module 10A, and the description of similar parts will be omitted.

Note that, although the high-frequency module 10E includes a filter 31E and a filter 32E, these filters are identical to the filter 31 and the filter 32, respectively except for communication bands to be assigned. Here, an aspect in which the communication band assigned to the filter 32E is higher in frequency than the communication band assigned to the filter 31E, or an aspect in which a performance requirement for the communication band assigned to the filter 32E is stricter than that for the communication band assigned to the filter 31E is applied.

As illustrated in FIG. 9, in the high-frequency module 10E, the terminal Ps4 and the terminal Ps5 are disposed closer to an outer edge side (the side surface side) than a center of the high-frequency switch 11E, as compared to the terminal Ps1, the terminal Ps2, and the terminal Ps3. That is, the terminals connected to the filter 31E and the filter 32E, to which communication bands relatively high in frequency are assigned, are disposed closer to the outer edge side (the side surface side) than the center of the high-frequency switch 11E, compared to the terminals connected to the filter 21, the filter 22, and the terminal 23A, to which communication bands relatively low in frequency are assigned.

According to this configuration, while a transmission distance for a multiplexer type filter is made shorter than a transmission distance for a single filter, a transmission distance of a high-frequency signal in a communication band relatively high in frequency can be made as short as possible. Thus, the high-frequency module 10E can suppress transmission loss for a high-frequency signal in a communication band high in frequency for which transmission loss is more likely to occur.

Additionally, as illustrated in FIG. 9, in the high-frequency module 10E, the terminal Ps5 of the high-frequency switch 11E connected to the filter 32E is disposed closer to the outer edge side (the side surface) of the high-frequency switch 11E than the center of the high-frequency switch 11E, compared to the terminal Ps4 of the high-frequency switch 11E connected to the filter 31E. Thereby, a distance of the connection circuit 45 connected to the filter 32E is made shorter than that of the connection circuit 44 connected to the filter 31E. Note that, a base body 100E in FIG. 9 is similar to the base body 100A, and a composite device 13E is similar to the composite device 13A.

As a result, in an aspect in which the communication band assigned to the filter 32E is higher in frequency than the communication band assigned to the filter 31E, it is possible to suppress transmission loss for a high-frequency signal in a communication band high in frequency for which transmission loss is more likely to occur. In addition, in an aspect in which a performance requirement for the communication band assigned to the filter 32E is stricter than that for the communication band assigned to the filter 31E, transmission loss can be suppressed for a high-frequency signal in a communication band for which a performance request is strict.

Additionally, as illustrated in FIG. 9, the antenna-side terminal Ps0 of the high-frequency switch 11E is disposed at a position closer to the center of the high-frequency switch 11E than the outer edge of the high-frequency switch 11E. With this configuration, the terminal Ps0 is disposed at a distance within a predetermined range from each of the terminal Ps1, the terminal Ps2, the terminal Ps3, the terminal Ps4, and the terminal Ps5. Accordingly, none of the terminal Ps1, the terminal Ps2, the terminal Ps3, the terminal Ps4, and the terminal Ps5 is disposed so as to be largely spaced apart from the terminal Ps0. As a result, transmission loss due to an increase in transmission distance in the high-frequency switch 11E is suppressed, for all of the terminal Ps1, the terminal Ps2, the terminal Ps3, the terminal Ps4, and the terminal Ps5.

In particular, as described above, in the configuration in which the terminal Ps4 and the terminal Ps5 are closer to the outer edge than the terminal Ps1, the terminal Ps2, and the terminal Ps3, the respective distances from the terminal Ps0 to the terminal Ps4 and the terminal Ps5 are made long, depending on an arrangement form of the terminal Ps0. However, by including this configuration, the respective distances from the terminal Ps0 to the terminal Ps4 and the terminal Ps5 can be shortened, and the high-frequency module 10E can suppress transmission loss between the terminal Ps0 and the terminal Ps4 and the terminal Ps5.

Seventh Embodiment

Figure 10:
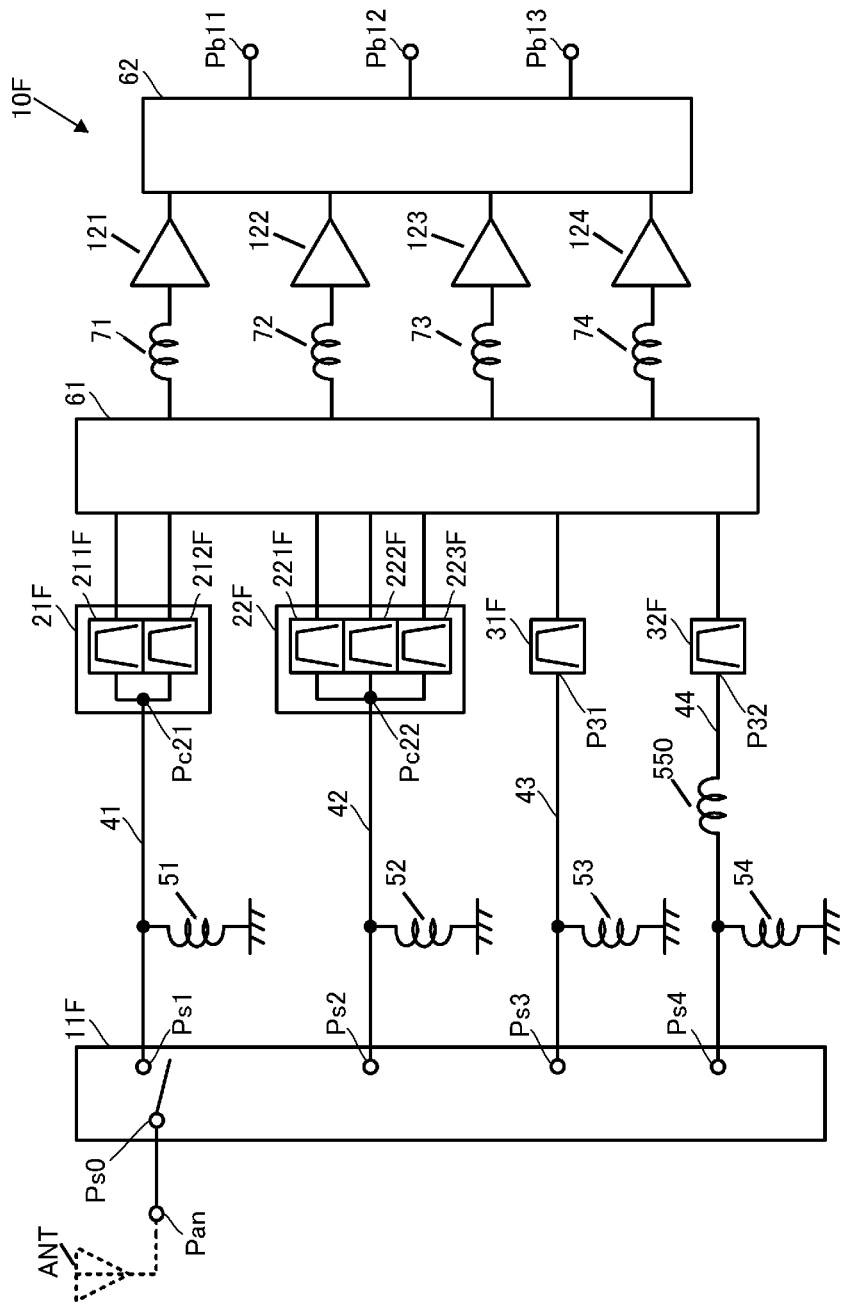
FIG. 10 is a schematic circuit diagram of a high-frequency module according to a seventh embodiment of the present disclosure.
Figure 11A:
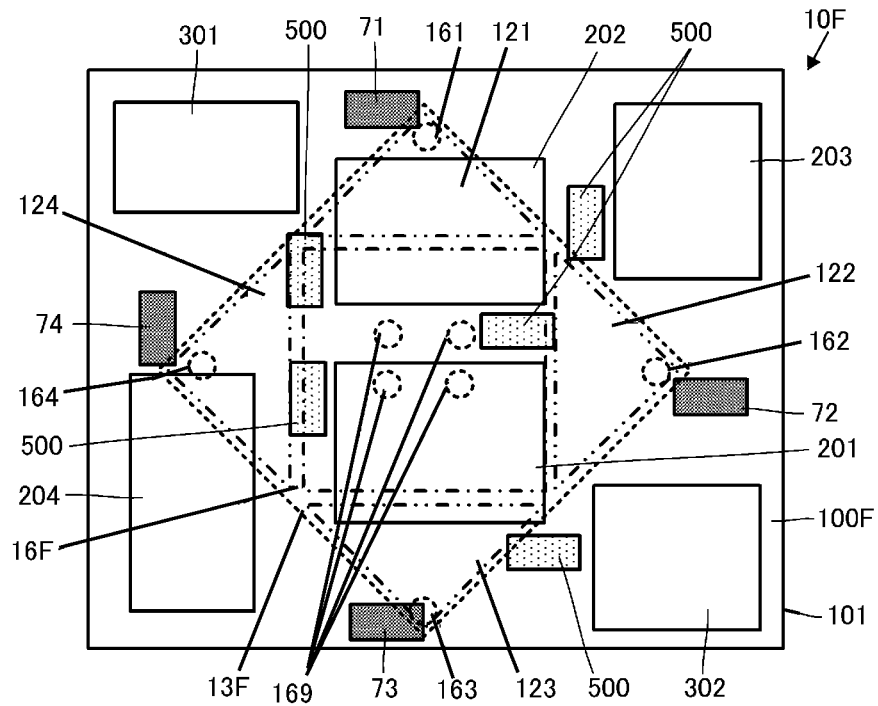
FIG. 11A is a plan view illustrating a configuration on a side of a first main surface of the high-frequency module according to the seventh embodiment of the present disclosure.
Figure 11B:
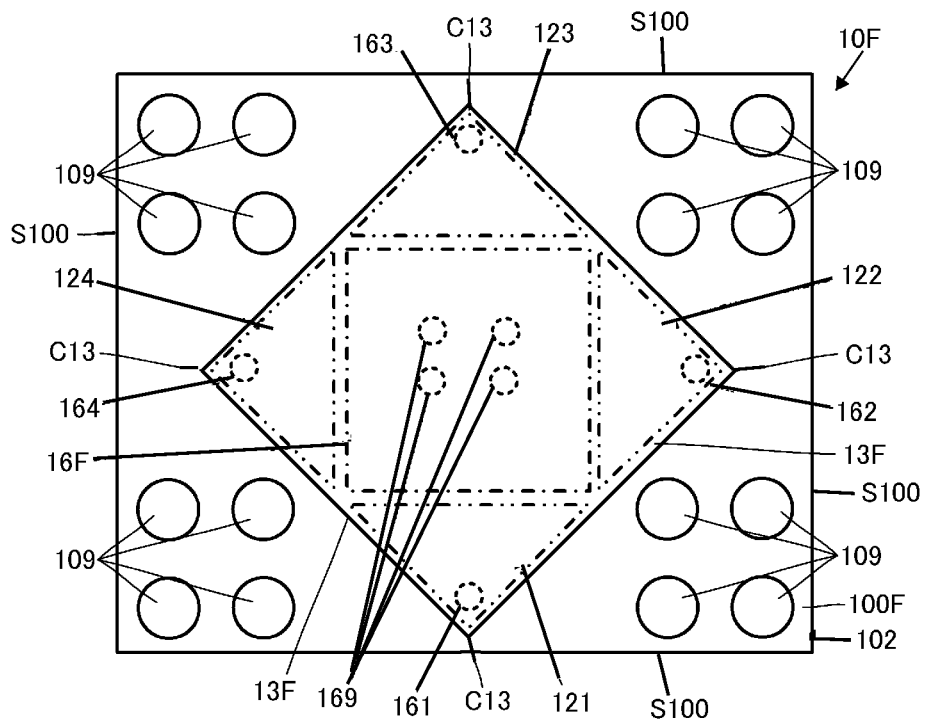
FIG. 11B is a plan view illustrating a configuration on a side of a second main surface of the high-frequency module according to the seventh embodiment of the present disclosure.

Next, a high-frequency module according to a seventh embodiment of the present disclosure will be described with reference to the drawings. FIG. 10 is a schematic circuit diagram of the high-frequency module 10F according to the seventh embodiment of the present disclosure. FIG. 11A is a plan view illustrating a configuration of a first main surface side of the high-frequency module 10F according to the seventh embodiment of the present disclosure. FIG. 11B is a plan view illustrating a configuration of a second main surface side of the high-frequency module 10F according to the seventh embodiment of the present disclosure.

Circuit Configuration

A basic circuit configuration and the structure of the high-frequency module 10F according to the seventh embodiment are similar to those of the high-frequency module according to the above-described embodiment.

As illustrated in FIG. 10, the high-frequency module 10F includes a high-frequency switch 11F, a filter 21F, a filter 22F, a filter 31F, a filter 32F, the matching element 51, the matching element 52, the matching element 53, the matching element 54, the matching element 550, a high-frequency switch 61, a high-frequency switch 62, a matching element 71, a matching element 72, a matching element 73, a matching element 74, a LNA 121, a LNA 122, a LNA 123, and a LNA 124. The high-frequency module 10F includes the terminal Pan, a terminal Pb11, a terminal Pb12, and a terminal Pb13. The configuration illustrated in FIG. 10 is an example, and any configuration can be applied to the present embodiment as long as the configuration includes a composite device in which a LNA is integrated with a high-frequency switch, a filter, and a matching element.

The high-frequency switch 11F includes the terminal Ps0, the terminal Ps1, the terminal Ps2, the terminal Ps3, and the terminal Ps4. The high-frequency switch 11F selectively connects one of the terminal Ps1, the terminal Ps2, the terminal Ps3, and the terminal Ps4 to the terminal Ps0. The terminal Ps0 is connected to the terminal Pan. Note that, the terminal Pan is connected to the antenna ANT.

The filter 21F is a multiplexer type filter, and includes a filter 211F and a filter 212F. The common terminal Pc21 of the filter 211F and the filter 212F is connected to the terminal Ps1 of the high-frequency switch 11F via the connection circuit 41. Each of an individual terminal of the filter 211F and an individual terminal of the filter 212F is connected to the high-frequency switch 61.

The filter 22F is a multiplexer type filter, and includes a filter 221F, a filter 222F, and a filter 223F. The common terminal Pc22 of the filter 221F, the filter 222F, and the filter 223F is connected to the terminal Ps2 of the high-frequency switch 11F via the connection circuit 42. Each of an individual terminal of the filter 221F, an individual terminal of the filter 222F, and an individual terminal of the filter 223F is connected to the high-frequency switch 61.

The filter 31F is a single filter. One end of the filter 31F is connected to the terminal Ps3 of the high-frequency switch 11F via the connection circuit 43. Another end of the filter 31F is connected to the high-frequency switch 61.

The filter 32F is a single filter. One end of the filter 32F is connected to the terminal Ps4 of the high-frequency switch 11F via the connection circuit 44. Another end of the filter 32F is connected to the high-frequency switch 61.

The matching element 51, the matching element 52, the matching element 53, the matching element 54, and the matching element 550 are each an inductor. The matching element 51 is connected between the connection circuit 41 and ground potential, the matching element 52 is connected between the connection circuit 42 and the ground potential, the matching element 53 is connected between the connection circuit 43 and the ground potential, and the matching element 54 is connected between the connection circuit 44 and the ground potential. The matching element 550 is disposed in series in the connection circuit 44.

The high-frequency switch 61 selectively connects any one of the filter 211F, the filter 212F, the filter 221F, the filter 222F, the filter 223F, the filter 31F, and the filter 32F to the corresponding one of the matching element 71, the matching element 72, the matching element 73, and the matching element 74. The matching element 71, the matching element 72, the matching element 73, and the matching element 74 are each an inductor.

The matching element 71 is connected to an input terminal of the LNA 121, the matching element 72 is connected to an input terminal of the LNA 122, the matching element 73 is connected to an input terminal of the LNA 123, and the matching element 74 is connected to an input terminal of the LNA 124. An output terminal of the LNA 121, an output terminal of the LNA 122, an output terminal of the LNA 123, and an output terminal of the LNA 124 are connected to the high-frequency switch 62.

The high-frequency switch 62 selectively connects any one of the LNA 121, the LNA 122, the LNA 123, and the LNA 124 to the corresponding one of the terminals Pb11, Pb12, and Pb13.

Structure

As illustrated in FIG. 11A and FIG. 11B, the high-frequency module 10F includes a base body 100F, a composite device 13F, a filter element 201, a filter element 202, a filter element 203, a filter element 204, a filter element 301, a filter element 302, a plurality of matching elements 500, the matching element 71, the matching element 72, the matching element 73, the matching element 74, and a plurality of mounting terminals 109. The plurality of matching elements 500 corresponds to a "first matching element" of the present disclosure, and the matching element 71, the matching element 72, the matching element 73, and the matching element 74 each correspond to a "second matching element" of the present disclosure.

The base body 100F is mainly formed of an insulating substrate, and has the main surface 101 and the main surface 102 parallel and opposed to each other. The base body 100F includes the main surface 101, the main surface 102, and four side surfaces S100, and includes a conductor pattern for realizing a circuit of the high-frequency module 10F illustrated in FIG. 10 inside thereof.

The composite device 13F is realized by, for example, a semiconductor element. The composite device 13F includes a switching region 16F, the LNA 121, the LNA 122, the LNA 123, and the LNA 124. In the switching region 16F, the high-frequency switch 11F, the high-frequency switch 61, and the high-frequency switch 62 are formed.

The composite device 13F has a substantially rectangular shape in plan view. Four corner portions C13 are included. The LNA 121, the LNA 122, the LNA 123, and the LNA 124 are formed at the respective corner portions C13. The switching region 16F is formed in a central region of the composite device 13F surrounded by the four LNAs.

The composite device 13F includes a LNA terminal 161, a LNA terminal 162, a LNA terminal 163, a LNA terminal 164, and a plurality of switch terminals 169.

The filter element 201, the filter element 202, the filter element 203, the filter element 204, the filter element 301, and the filter element 302 are each a mounted type filter element, and are each realized by, for example, an acoustic wave filter. The filter element 201, the filter element 202, the filter element 203, and the filter element 204 form the filter 211F, the filter 212F, the filter 221F, the filter 222F, and the filter 223F, in terms of circuit. The filter element 301 and the filter element 302 constitute the filter 31F and the filter 32F, in terms of circuit.

The plurality of matching elements 500 constitute, in terms of circuit, the matching element 51, the matching element 52, the matching element 53, the matching element 54, and the matching element 550.

The composite device 13F is mounted on the main surface 102 of the base body 100F. Accordingly, the LNA terminal 161, the LNA terminal 162, the LNA terminal 163, the LNA terminal 164, and the plurality of switch terminals 169 of the composite device 13F are connected to a conductor pattern of the base body 100F.

The composite device 13F is mounted such that a side surface of the composite device 13F is not parallel to the side surface S100 of the base body 100F, in other words, a predetermined angle is formed. With this configuration, each of the corner portions C13 of the composite device 13F is disposed close to the corresponding one of the side surfaces S100 of the base body 100F. Each of the corner portions C13 is disposed at a substantially central portion of the corresponding one of the side surfaces S100 of the base body 100F. Therefore, each of the LNA terminal 161, the LNA terminal 162, the LNA terminal 163, and the LNA terminal 164 of the composite device 13F is connected to the substantially central portion of the corresponding one of the side surfaces S100 of the base body 100F. Further, the plurality of switch terminals 169 of the composite device 13F is connected to a central region of the base body 100F.

The plurality of mounting terminals 109 is disposed near the corner portion of the main surface 102 of the base body 100F. Since the composite device 13F has the shape and is disposed as described above, the plurality of mounting terminals 109 can be concentrated and disposed at the corner portion of the base body 100F in this manner.

The filter element 201, the filter element 202, the filter element 203, the filter element 204, the filter element 301, and the filter element 302 are mounted on the main surface 101 of the base body 100F. At this time, it is preferable that the filter element 201, the filter element 202, the filter element 203, and the filter element 204 be disposed close to a center of the base body 100F as much as possible. Further, it is preferable that the filter element 301 and the filter element 302 be disposed close to the respective corner portions of the base body 100F as much as possible.

The plurality of matching elements 500 is mounted on the main surface 101 of the base body 100F. The plurality of matching elements 500 are disposed between the switch terminals 169 and the respective filter elements, and are disposed close to the center of the base body 100F, in other words, disposed so as to be proximate to or overlap with the switching region 16F in the composite device 13F in plan view.

The matching element 71, the matching element 72, the matching element 73, and the matching element 74 are mounted on the main surface 101 of the base body 100F. In plan view of the base body 100F, the matching element 71 is disposed in a vicinity of the LNA terminal 161 (in a vicinity of the corner portion C13 of the composite device 13F), and the matching element 72 is disposed in a vicinity of the LNA terminal 162 (in a vicinity of the corner portion C13 of the compound device 13F). The matching element 73 is disposed in a vicinity of the LNA terminal 163 (in a vicinity of the corner portion C13 of the composite device 13F), and the matching element 74 is disposed in a vicinity of the LNA terminal 164 (in a vicinity of the corner portion C13 of the compound device 13F). Accordingly, a distance of a transmission path connecting each of the LNAs and the corresponding one of the matching elements is made short. Thereby, stray capacitance generated in this transmission path is suppressed.

Additionally, according to this arrangement, each of the matching element 71, the matching element 72, the matching element 73, and the matching element 74 is disposed in a vicinity of the corresponding one of the side surfaces S100 of the base body 100F. In addition, the matching element 500 is disposed near the center of the base body 100F. Thus, the matching element 71, the matching element 72, the matching element 73, and the matching element 74, and the respective matching elements 500 are disposed at a distance from each other, rather than brought close to each other. Accordingly, the coupling between the matching element 71, the matching element 72, the matching element 73, and the matching element 74 and the respective matching elements 500 is suppressed, and transmission characteristics of the high-frequency module 10F are improved.

Additionally, according to this configuration, while suppressing an increase in size of the base body 100F, it is possible to increase the respective distances in the high-frequency module 10F between the plurality of mounting terminals 109 and the LNA terminal 161, the LNA terminal 162, the LNA terminal 163, and the LNA terminal 164. Accordingly, the coupling between the plurality of mounting terminals 109 and the LNA terminal 161, the LNA terminal 162, the LNA terminal 163, and the LNA terminal 164 can be suppressed, and the characteristics of the high-frequency module 10F are improved.

Note that, the configurations of the above-described embodiments can be combined as appropriate, and the above-described functions and effects can be achieved according to the combination of these embodiments.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency module, comprising:
   a switch having a common terminal, and a first selection terminal and a second selection terminal one of which is selectively connected to the common terminal;
   a multiplexer connected to the first selection terminal; and
   a single filter connected to the second selection terminal, wherein
   an electrical distance of a first transmission path connecting the first selection terminal and the multiplexer is shorter than an electrical distance of a second transmission path connecting the second selection terminal and the single filter.

2. A high-frequency module, comprising:
   a high-frequency switch having an antenna-side terminal and a plurality of filter-side terminals, and selectively connecting one of the plurality of filter-side terminals to the antenna-side terminal;
   at least one first filter including a plurality of filters having characteristics different from each other, and a common terminal common to the plurality of filters;
   at least one second filter including one filter;
   at least one first circuit connecting a first terminal of the plurality of filter-side terminals and the first filter; and
   at least one second circuit connecting a second terminal of the plurality of filter-side terminals to one terminal of the second filter, wherein
   a signal transmission distance of the first circuit is shorter than a signal transmission distance of the second circuit.

3. The high-frequency module according to claim 2, wherein
   the at least one first filter includes a plurality of first filters and the at least one second filter includes a plurality of second filters,
   the at least one first circuit includes a plurality of first circuits and the at least one second circuit includes a plurality of second circuits, and
   a signal transmission distance of a longest first circuit of the plurality of first circuits is shorter than a signal transmission distance of a shortest second circuit of the plurality of second circuits.

4. The high-frequency module according to claim 3, wherein
   the plurality of filters having the characteristics different from each other and constituting the first filter perform filtering of a high-frequency signal in each of a plurality of communication bands in which communication is performed simultaneously.

5. The high-frequency module according to claim 3, wherein
   a frequency band of a second communication band in which filtering is performed by the second filter is higher in frequency than a frequency band of a first communication band in which filtering is performed by the first filter.

6. The high-frequency module according to claim 2, wherein
   the plurality of filters having the characteristics different from each other and constituting the first filter perform filtering of a high-frequency signal in each of a plurality of communication bands in which communication is performed simultaneously.

7. The high-frequency module according to claim 2, wherein
   a frequency band of a second communication band in which filtering is performed by the second filter is higher in frequency than a frequency band of a first communication band in which filtering is performed by the first filter.

8. The high-frequency module according to claim 2, further comprising a base body on which the high-frequency switch, the first filter, and the second filter are mounted, wherein the second filter is disposed at a position further from the switch than the first filter.

9. The high-frequency module according to claim 8, wherein the base body has a first surface and a second surface opposite to each other, the first filter and the second filter are mounted on the first surface, the high-frequency switch is mounted on the second surface, and in plan view of the base body, the first filter and the high-frequency switch overlap with each other, and the second filter and the high-frequency switch do not overlap with each other.

10. The high-frequency module according to claim 8, wherein in plan view of the base body, the second terminal of the high-frequency switch is disposed closer to an outer edge side of the high-frequency switch than the first terminal.

11. The high-frequency module according to claim 8, wherein when the at least one second filter includes a plurality of second filters, in plan view of the base body, a second terminal, to which a third filter for performing filtering in a communication band having a highest frequency of the plurality of second filters is connected, is disposed closer to an outer edge side of the high-frequency switch than a second terminal, to which a fourth filter different from the third filter of the plurality of second filters is connected.

12. The high-frequency module according to claim 2, wherein in plan view of a base body, the antenna-side terminal of the high-frequency switch is disposed closer to a center side of the high-frequency switch than the first terminal and the second terminal.

13. The high-frequency module according to claim 2, further comprising:

a composite device having a rectangular shape in plan view, and including the high-frequency switch and an LNA;

a first matching element connected between the high-frequency switch and the first filter or the second filter;

a second matching element connected between the first filter or the second filter and the LNA;

a base body having a rectangular shape in plan view, and including a first main surface and a second main surface opposite to each other, the first matching element, the second matching element, the first filter, and the second filter being mounted on the first main surface, the composite device being mounted on the second main surface, wherein the composite device is mounted on the base body such that a side surface of the composite device forms a predetermined angle with a side surface of the base body.

14. The high-frequency module according to claim 13, wherein the LNA is formed at a corner portion of the composite device, the high-frequency switch is formed at a center portion of the composite device, and an LNA terminal connected to the LNA is formed at the corner portion of the composite device, the second matching element is mounted near the corner portion of the composite device in plan view of the base body, and the first matching element is mounted at a position closer to a formation region of the high-frequency switch in plan view of the base body than the second matching element.

15. The high-frequency module according to claim 13, wherein:

the composite device is mounted at a center of the second main surface in a first direction, the high-frequency switch is formed at a first end portion of the of the second main surface in a second direction, and the LNA is formed at a second end portion of the second main surface.

16. The high-frequency module according to claim 15, wherein the first direction and the second direction are orthogonal to each other.

17. The high-frequency module according to claim 15, wherein:

the composite device is mounted on the base body such that a side surface of the composite device is not parallel to a side surface of the base body.

18. The high-frequency module according to claim 13, wherein the high-frequency switch is formed at a first end portion of the base body in a first direction, and the LNA is formed at a second end portion of the base body in a second direction.

19. The high-frequency module according to claim 18, wherein the first direction and the second direction are orthogonal to each other.

20. The high-frequency module according to claim 13, wherein:

the composite device is mounted on the base body such that a side surface of the composite device is not parallel to a side surface of the base body.

* * * * *